(12) United States Patent
Sang

(10) Patent No.: US 7,659,565 B2
(45) Date of Patent: Feb. 9, 2010

(54) CMOS IMAGE SENSOR WITH A MICROLENS AND METHOD FOR FABRICATING THE SAME

(75) Inventor: Cho Eun Sang, Suwon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 536 days.

(21) Appl. No.: 11/504,559

(22) Filed: Aug. 14, 2006

(65) Prior Publication Data

US 2007/0034916 A1    Feb. 15, 2007

(30) Foreign Application Priority Data

Aug. 12, 2005    (KR) .................. 10-2005-0074028

(51) Int. Cl.
*H01L 31/14* (2006.01)
(52) U.S. Cl. ........................... 257/294; 257/292
(58) Field of Classification Search ............ 257/98, 257/293, 294, E33.068, E33.073
See application file for complete search history.

(56) References Cited

U.S. PATENT DOCUMENTS

| 6,417,022 B1* | 7/2002 | Hsiao et al. ................ 438/70 |
| 2006/0033131 A1* | 2/2006 | Kim ........................... 257/292 |
| 2006/0057928 A1* | 3/2006 | Nagasaka et al. ............ 445/49 |
| 2006/0124948 A1* | 6/2006 | Lee ............................ 257/98 |

\* cited by examiner

*Primary Examiner*—Wael Fahmy
*Assistant Examiner*—Abdul Kalam
(74) *Attorney, Agent, or Firm*—The Law Offices of Andrew D. Fortney; Andrew D. Forntey

(57) ABSTRACT

A CMOS image sensor and a method for fabricating the same are provided. A CMOS image sensor includes: a plurality of photodiodes a predetermined distance apart on a semiconductor substrate; an insulation layer on an entire surface of the semiconductor substrate; a passivation layer on the insulation layer; a plurality of color filters on the passivation layer corresponding to the photodiodes; a planarization layer on an entire surface of the semiconductor substrate including the color filters; and a microlens on the planarization layer corresponding to each of the color filters and having a bottom diameter of 2.5 to 3.0 μm.

20 Claims, 5 Drawing Sheets

CMOS IMAGE SENSOR WITH A MICROLENS AND METHOD FOR FABRICATING THE SAME

BACKGROUND OF THE INVENTION

1. Field of the Invention

The present invention relates to a complementary metal oxide semiconductor (CMOS) image sensor and a method for fabricating the same.

2. Description of the Related Art

An image sensor is a semiconductor device that converts an optical image into electric signals. Examples of the image sensor include a charge coupled device (CCD) and a CMOS image sensor.

In the CCD, metal oxide semiconductor (MOS) capacitors are very closely adjacent to each other, and charge carriers are stored in and transferred into and/or from the MOS capacitor.

Through a CMOS technology using a control circuit and a signal processing circuit as peripheral circuitry, the CMOS image sensor includes a particular number of MOS transistors per unit pixel, and employs a switching method that sequentially detects outputs of the unit pixels using the MOS transistors.

However, a method for driving the CCD is relatively complex and consumes relatively large amounts of power. Moreover, there are more disadvantages in that processes are more complex due to the large number of mask process steps, and it is hard to integrate a signal processing circuit into a CCD chip. To overcome these problems, the CMOS image sensor has been under development.

The CMOS image sensor includes a photodiode and one or more MOS transistors in a unit pixel, and sequentially detects signals using a switching method to display an image. In a method for fabricating the CMOS image sensor, power consumption and the number of masks are less than those of the CCD image sensor. The number of masks for fabricating the CMOS image sensor is 20, and 20 to 40 for fabricating the CCD image sensor. Additionally, the CMOS image sensor can be placed on one chip with a plurality of signal processing circuits, and also can gain attentions for a next generation image sensor. The CMOS image sensor is widely used for an application device such as a digital still camera (DSC), a PC camera, and a mobile camera.

However, in related art CMOS image sensors, the transmittance of light incident to a photodiode through a microlens may deteriorate. Moreover, since a focal length of a microlens becomes longer when light is incident to a photodiode through the microlens, the sensitivity of the related art CMOS image sensor may deteriorate.

SUMMARY OF THE INVENTION

Accordingly, the present invention is directed to a CMOS image sensor and a method for fabricating the same that substantially obviate one or more problems due to limitations and disadvantages of the related art.

An object of the present invention is to provide a CMOS image sensor with an improved sensitivity by optimizing a diameter and a thickness of a microlens and a method for fabricating the same.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure(s) particularly pointed out in the written description and claims hereof as well as the appended drawings.

To achieve these objects and other advantages and in accordance with the purpose of the invention, as embodied and broadly described herein, there is provided a CMOS image sensor including: a plurality of photodiodes a predetermined distance apart on a semiconductor substrate; an insulation layer formed on an entire surface of the semiconductor substrate; a passivation layer on the insulation layer; a plurality of color filters on the passivation layer corresponding to the photodiodes; a planarization layer on an entire surface of the semiconductor substrate including the color filters; and a microlens on the planarization layer corresponding to each of the color filters and having a bottom diameter of 2.5 to 3.0 µm.

In another aspect of the present invention, there is provided a method for fabricating a CMOS image sensor, the method including: forming a plurality of photodiodes a predetermined distance apart on a semiconductor substrate; forming an insulation layer on an entire surface of the semiconductor substrate; forming a passivation layer on the insulation layer; forming a plurality of color filters on the passivation layer corresponding to the photodiodes, respectively; forming a planarization layer on an entire surface of the semiconductor substrate having the color filters; and forming a microlens having a bottom diameter of 2.5 to 3.0 µm on the planarization layer corresponding to each of the color filters.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
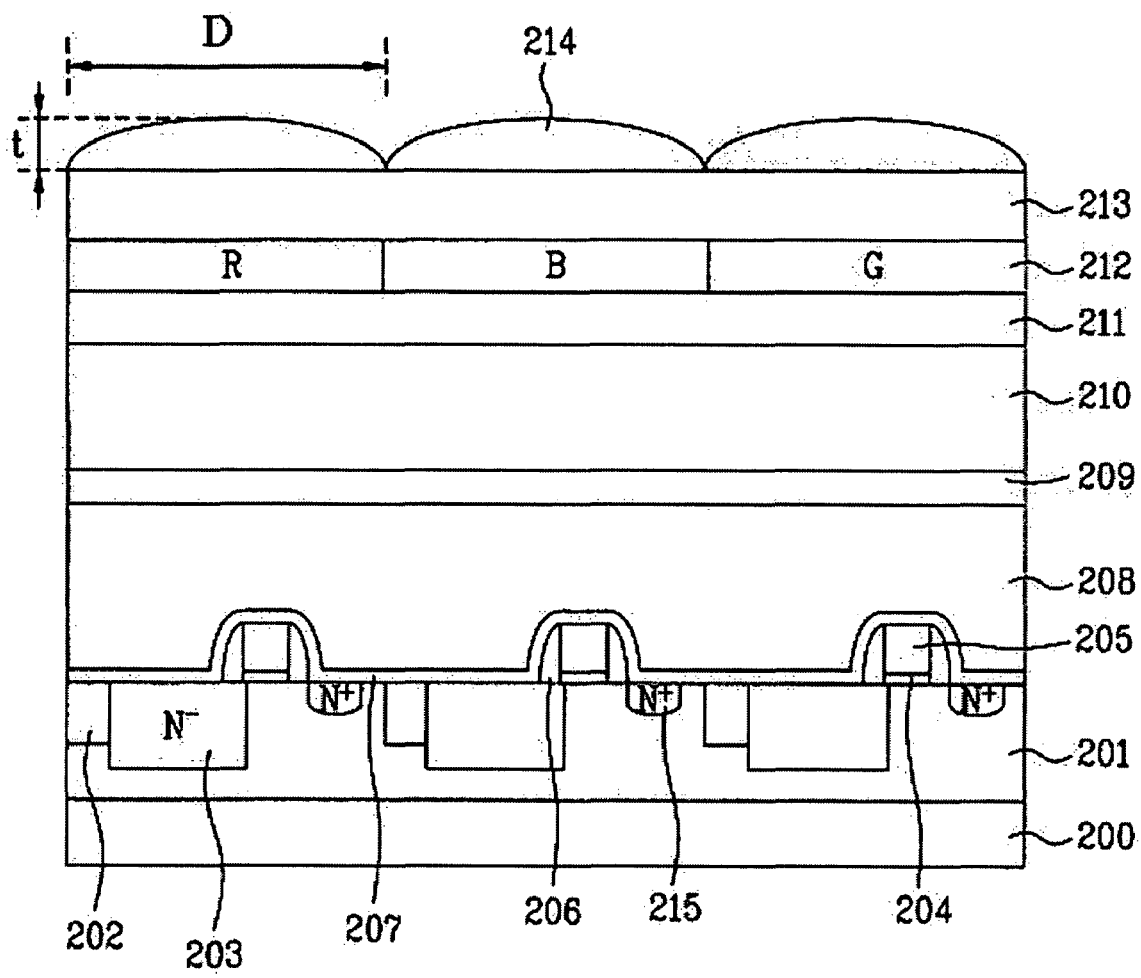
FIG. 1 a sectional view of a CMOS image sensor according to an embodiment of the present invention.

FIG. 1 a sectional view of a CMOS image sensor according to an embodiment of the present invention.

As illustrated in FIG. 1, the CMOS image sensor of the present invention includes a plurality of photodiodes and various transistors, which are formed on a semiconductor substrate 200 with a predetermined distance from each other.

A first interlayer insulation layer 208 is formed on entire surface of the semiconductor substrate 200 to cover the photodiodes and the various transistors. Various metal lines (not shown) are formed on the first interlayer insulation layer 208 with a predetermined distance from each other.

A barrier layer 209 can be formed on the first interlayer insulation layer 208. Barrier layer 209 can comprise or consist essentially of a nitride layer (e.g., SiN).

A second interlayer insulation layer 210 is formed on an entire surface of the semiconductor substrate 200 having the metal lines. A passivation layer 211 can be formed on the second interlayer insulation layer 210. The passivation layer 211 can be comprise or consist essentially a nitride layer (e.g., SiN).

Color filters 212 of red R, green G, and blue B, which correspond to each photodiode (preferably in a ratio of one color filter to one photodiode), are formed on the passivation layer 211. A planarization layer 213 is formed on an entire surface of the semiconductor substrate 200 having the color filter 212. Alternatively, the color filters may include yellow (Y), cyan (C) and magenta (M).

A microlens 214 corresponding to each color filter 212 and having a bottom diameter D of 2.5 to 3.0 μm is formed on the planarization layer 213. At this point, a thickness t of a microlens 214 is generally 0.41 to 0.49 μm with respect to the center of the bottom diameter D, and a thickness from the first interlayer insulation layer 208 to the planarization layer 213 is 4.9 to 5.4 μm. The focus of the microlens 214 which through light is transmitted reaches the photodiode through this thickness; thus, the focal length of the light path between the microlens and the corresponding photodiode may be from 4.9 to 5.4 μm.

Moreover, the focus of the microlens 214 reaches the photodiode in such a configuration when the first interlayer insulation layer 208 and the second interlayer insulation layer 210 have a refractive index of from 1.4 to 1.6 (e.g., about 1.5), the planarization layer 213 has a refractive index of from 1.5 to 1.65 (e.g., about 1.57), and the microlens 214 has a refractive index of from 1.5 to 1.7 (e.g., about 1.59).

A method for fabricating a CMOS image sensor will be described with reference to FIG. 1 according to an embodiment of the present invention.

First, p-type epitaxial layer 201 defined by a device isolation region and an active region (a photodiode region and a transistor region) is grown on a $p^{++}$-type semiconductor substrate 200. Additionally, a field oxide layer 202 separating input regions of green light, red light, and blue light is formed on a device isolation region of the semiconductor substrate 200.

Next, an n-type diffusion region 203 is formed on the photodiode in the semiconductor substrate 200. A reference number 215 refers to source and drain regions in a transistor.

A gate insulation layer 204 is inserted (e.g., by thermal growth or deposition and annealing) in a transistor region of the semiconductor substrate 200, a gate material is deposited thereon, and the gate material and gate insulation layer 204 are patterned to form a gate electrode 205. An insulation layer sidewall 206 is formed on both sides of the gate electrode 205. A diffusion preventive layer 207 is formed on an entire surface of the semiconductor substrate 200 having the gate electrode 205.

Next, a first interlayer insulation layer 208 is formed on the diffusion preventive layer 207, and various metal lines (not shown) can be formed on the first interlayer insulation layer 208 a predetermined distance from each other.

Additionally, a barrier layer 209 can be formed on the semiconductor substrate 200 having the metal lines.

A second interlayer insulation layer 210 is formed on the barrier layer 209 with a thickness of 4000 Å. A passivation layer 211 (e.g., a silicon nitride layer) can be formed on the second interlayer insulation layer 210 with a thickness of 3000 Å. The color filters 212 of red R, green G, and blue B (or yellow, cyan and magenta) can be formed on the passivation layer 211 to correspond to each of the n-type diffusion regions 203.

Next, a planarization layer 213 is formed on an entire surface of the semiconductor substrate 200 having each color filter 212. The microlens 214 having a bottom diameter D of 2.5 to 3.0 μm can be formed to correspond to each of color filters 212. At this point, a thickness t of a microlens 214 is 0.41 to 0.49 μm with respect to the center of the bottom diameter D, and a thickness from the first interlayer insulation layer 208 to the planarization layer 213 (e.g., a focal length of the light path between microlens 214 and photodiode 203) is 4.9 to 5.4 μm. The focus of the microlens 214 which through light is transmitted reaches the photodiode.

More specifically, photoresist for a microlens is applied to effectively concentrate light on the n-type diffusion region in an entire surface of the semiconductor substrate 200 having the planarization layer 213. Next, the photoresist is patterned by exposing the photoresist to light and developing the photoresist to form a microlens pattern.

In case the photoresist is a positive resist, since transmittance can be improved by dissolving a photoactive compound and/or an initiator (e.g., an absorber of photoresist), the photoactive compound remaining in the microlens pattern is dissolved by using a flood exposure. On the other hand, after improving the transmittance by performing the flood exposure on the microlens pattern, the flowability of the micro lens can be increased by generating an acid from a photoacid compound. The semiconductor substrate 200 having the microlens pattern may be placed on the top of a hot plate and thermally treated at a temperature of 300 to 700° C. to perform a reflow process on the microlens pattern. Thus, a semispherical micro lens 214 is formed, having a bottom diameter D of 2.5 to 3.0 μm and a thickness t of 0.41 to 0.49 μm with respect to the center of the bottom diameter D.

Next, the thermally treated and reflowed microlens 214 is cooled down. Here, the cooling process is performed when the semiconductor substrate 200 is disposed on a cool plate.

According to a CMOS image sensor and a method for fabricating the same of the present invention, the sensitivity of the micro lens 214 can be improved by optimizing a thickness t of the microlens 214, a bottom diameter D, and a thickness from the first interlayer insulation layer 208 to the planarization layer 213.

Figure 2:
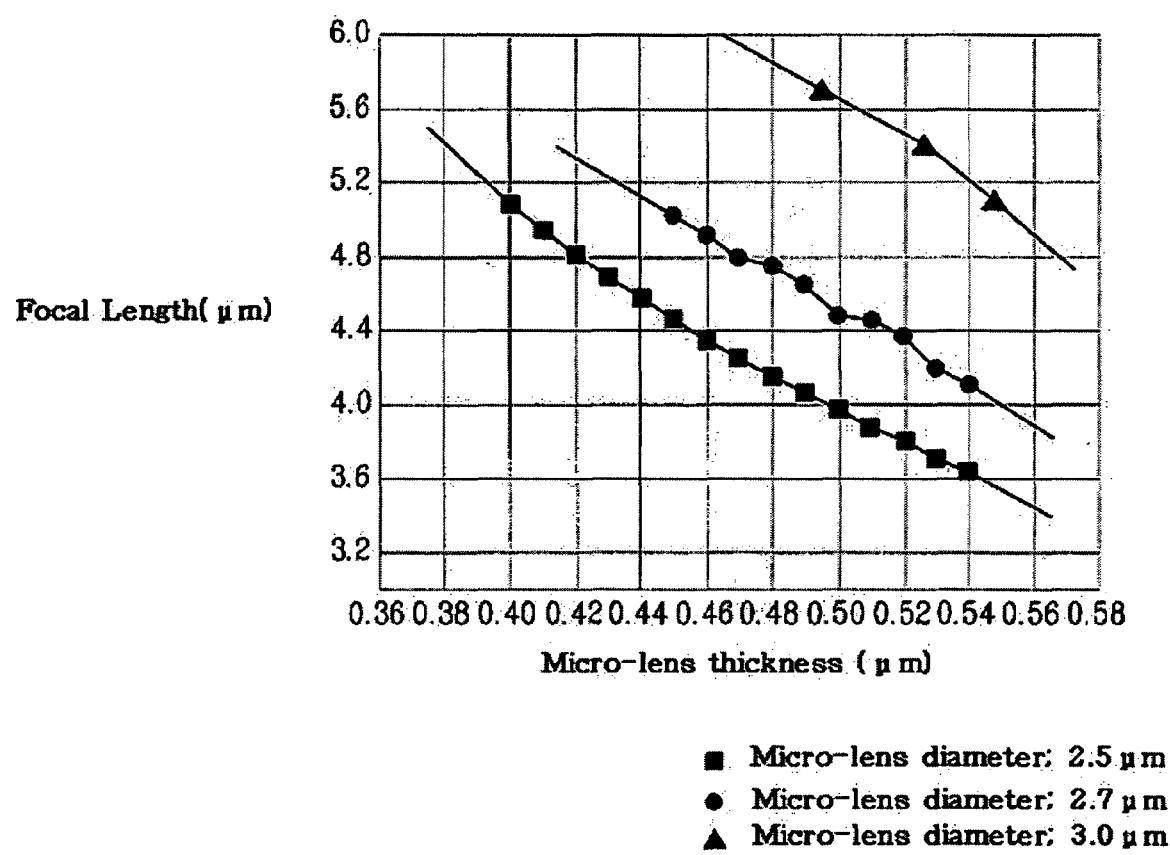
FIG. 2 is a graph simulating a focal length according to a bottom diameter and a thickness of a microlens of FIG. 1.

FIG. 2 is a graph of simulating a focal length according to a bottom diameter D and thickness t of a microlens 214 of FIG. 1. Referring to FIG. 2, the focal length of the microlens 214 is reduced when a thickness t of the microlens 124 decreases according to the bottom diameter D of the microlens 214.

FIG. 2 is a graph of calculating a focal length of the microlens 214 according to the thickness t of the microlens 214 when the bottom diameter D of the microlens 214 is 2.5 μm, 2.7 μm, and 3.0 μm, respectively. Assuming that process margins allow a variability in the thickness of an intermetal dielectric (IMD) up to 10%, the focal length may vary as a direct result up to ±5000 Å. However, the variability of the focal length in accordance with changes in the thickness t and/or the bottom diameter D of the microlens 214 is more than 2 μm. As a result, the sensitivity of the microlens 214 can be improved to a greater extent by controlling the thickness t and the bottom diameter D of the microlens 214 than the thickness of the IMD.

Accordingly, the CMOS image sensor of the present invention can improve the sensitivity of the microlens 214 by setting the bottom diameter D of the microlens 214 to be from 2.5 to 3.0 μm, and setting the thickness t of the microlens 214 to be from 0.41 to 0.49 μm with respect to the center of the bottom diameter D.

Figure 3:
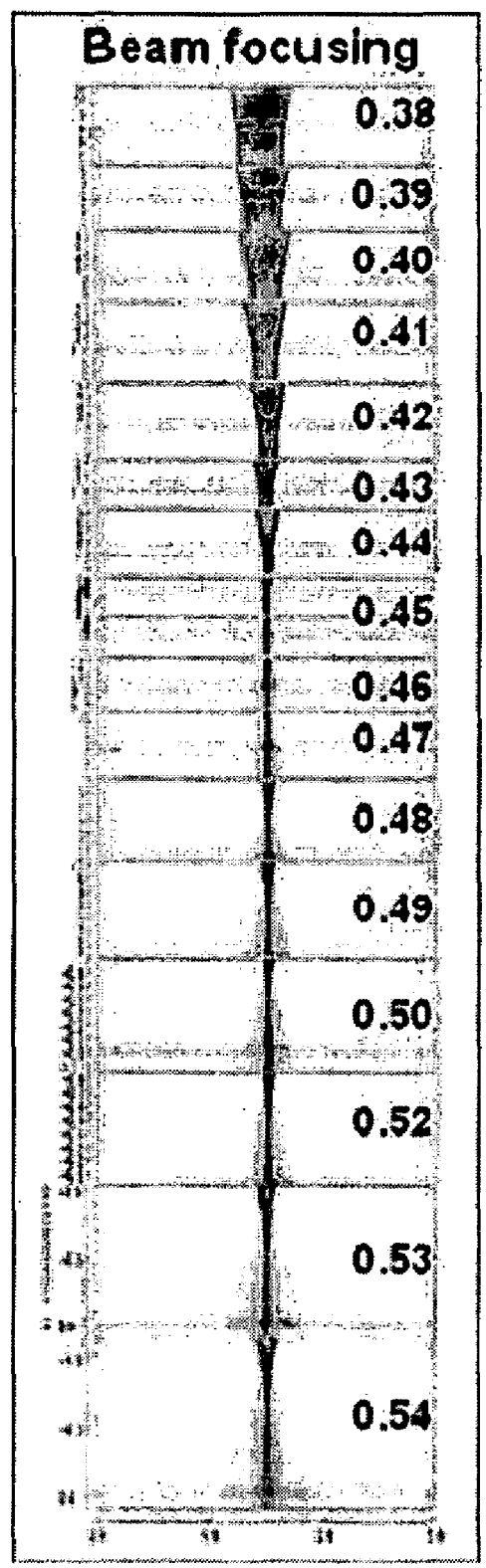
FIG. 3 is a view illustrating a change of a spot size of light reaching a photodiode region according to a thickness of a microlens of FIG. 1.

On the other hand, according to a CMOS image sensor and a method for fabricating the same of the present invention, when the bottom diameter D of the microlens 214 is 2.7 μm, the change of a spot size of light reaching the photodiode region as a function of microlens thickness is illustrated in FIG. 3.

Referring to FIG. 3, each number in the right side represents a thickness t of the microlens 214, and a red line in a region corresponding to each number represents a photodiode region. The focal length of light passing through the microlens 214 is not concentrated when the thickness t of the microlens 214 approaches 0.38 μm. The focal length has the smallest spot size at the thickness t of 0.45 μm. With the thickness t of 0.45 μm or more, the focal length becomes spread out. Accordingly, when the bottom diameter D of the microlens 214 is 2.7 μm, the thickness t of the microlens 214 is appropriate in the range of 0.41 to 0.49 μm, and the most appropriate thickness is 0.45 μm ±15%.

Figure 4:
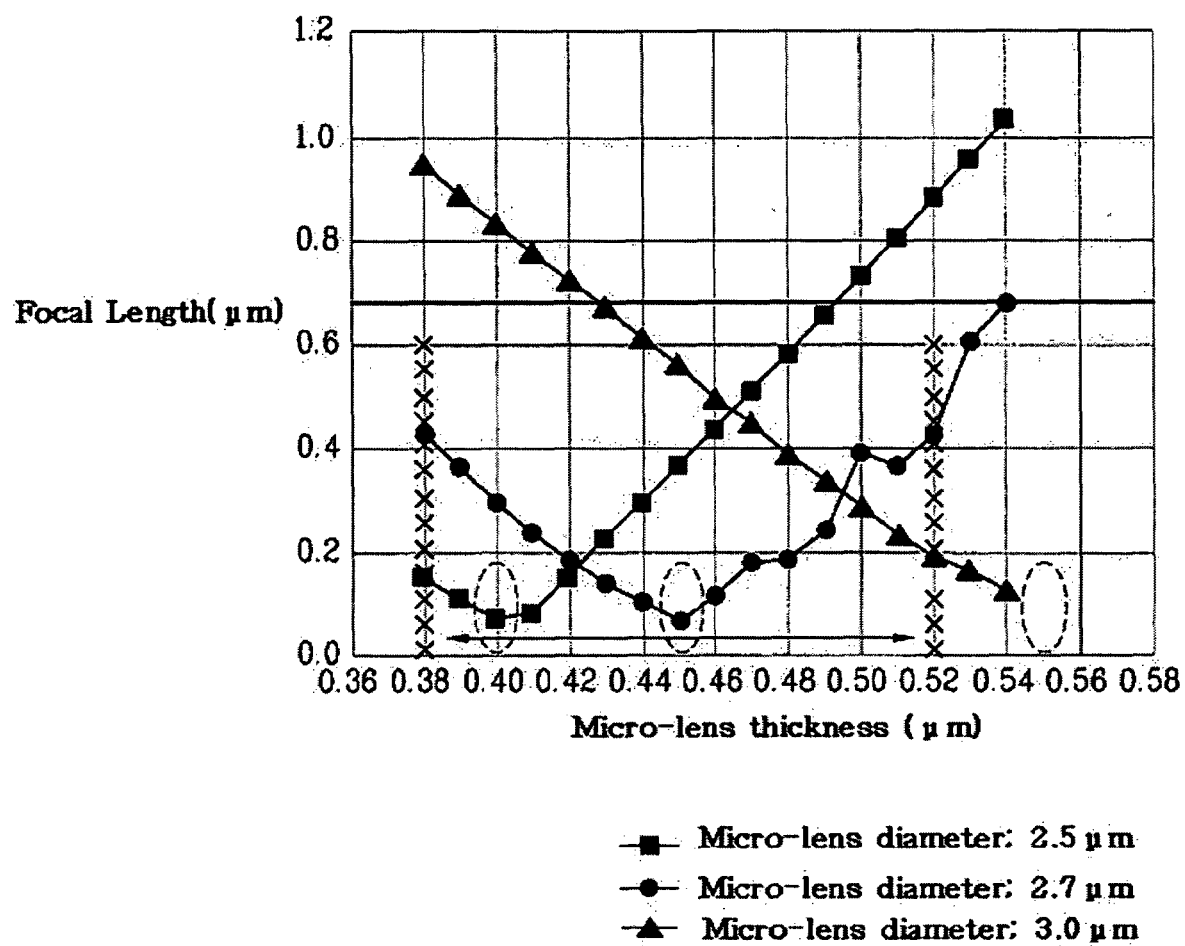
FIG. 4 is a graph of a spot size characteristic of light when diameters of a microlens of FIG. 1 are 2.5 µm, 2.7 µm, and 3.0 µm, respectively.

On the other hand, FIG. 4 is a graph of a spot size characteristic of light when the diameter of the microlens of FIG. 1 is 2.5 μm, 2.7 μm, or 3.0 μm, respectively.

The spot size is optimized at 0.06 μm when the thickness t of the microlens 214 is 0.45 μm ±15% and the bottom diameter of the microlens 214 is 2.7 μm according to FIGS. 3 and 4. Similarly, the spot size is optimized at 0.06 μm when the thickness t of the microlens 214 is 0.40 μm ±15% and the bottom diameter of the microlens 214 is 2.5 μm, and when the thickness t of the microlens 214 is 0.55-0.56 μm ±15% and the bottom diameter of the microlens 214 is 3.0 μm, according to FIG. 4.

Figure 5:
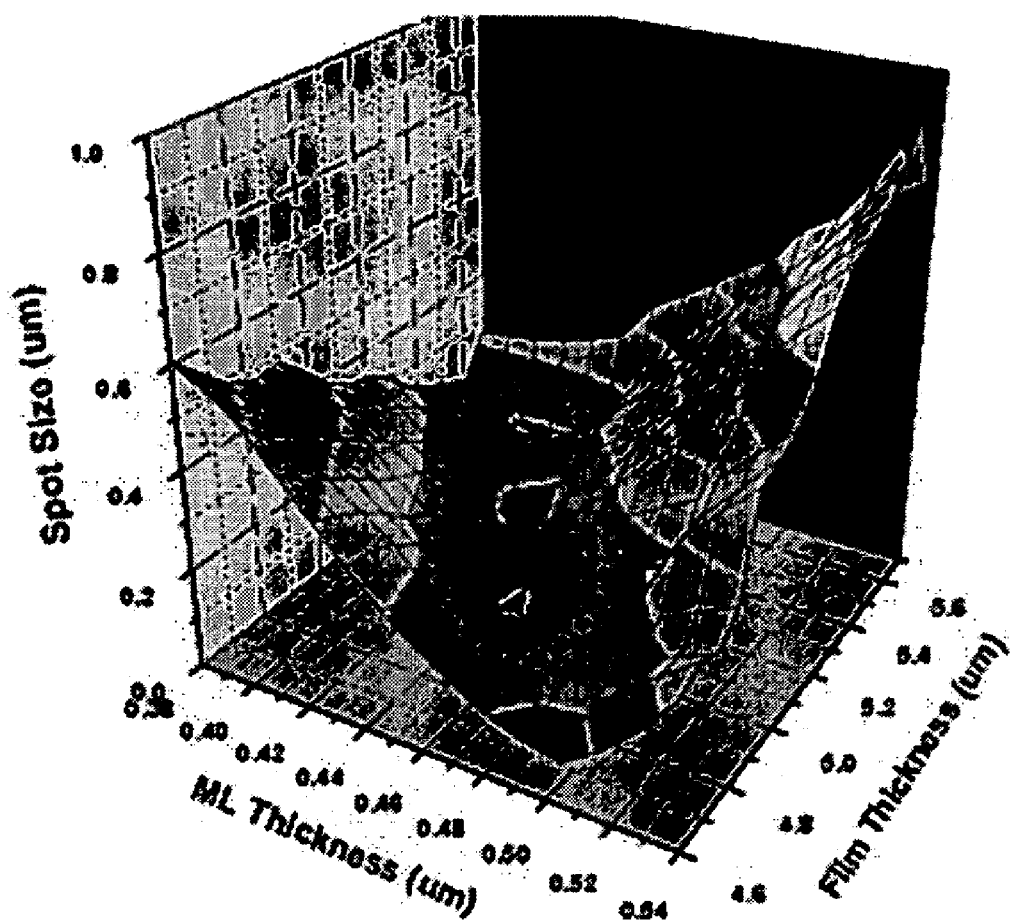
FIG. 5 is a recommended process window according to a spot size, a microlens thickness and a film thickness.

According to simulation results of FIGS. 2 to 4, a recommended process window of the microlens 214 can be obtained as illustrated in FIG. 5. A dotted portion of FIG. 5 becomes a process window that will be an allowable value in processes.

According to a CMOS image sensor and a method for fabricating the same of the present invention, the recommended process window allows the focus of the microlens 214 to accurately reach the photodiode region when the thickness t of the microlens 214 is 0.41 to 0.49 μm with respect to the center of the bottom diameter D, and the thickness t from the first interlayer insulation layer 208 to the planarization layer 123 (e.g., the focal length) is 4.9 to 5.4 μm, with respect to the micro lens 214 having the bottom diameter D of 2.5 to 3.0 μm. Consequently, the sensitivity of the image sensor can be improved.

According to a CMOS image sensor and a method for fabricating the same of the present invention, the operational characteristics and the sensitivity in the image sensor can be improved by optimizing the thickness and the bottom diameter of the microlens.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A CMOS (complementary metal oxide semiconductor) image sensor comprising:
    a plurality of photodiodes a predetermined distance apart from each other on a semiconductor substrate;
    an insulation layer on an entire surface of the semiconductor substrate;
    a passivation layer on the insulation layer;
    a plurality of color filters on the passivation layer corresponding to the photodiodes;
    a planarization layer on an entire surface of the semiconductor substrate including the color filters; and
    a microlens formed on the planarization layer corresponding to each of the color filters and having a bottom diameter of 2.5 to 3.0 μm and a thickness of 0.41 to 0.49 μm with respect to a center of the bottom diameter of the microlens, wherein the microlens is adapted to focus light on the photodiode.

2. The CMOS image sensor according to claim 1, wherein a focal length through the image sensor is 4.9 to 5.4 μm.

3. The CMOS image sensor according to claim 1, wherein a ratio of the thickness of the microlens to the bottom diameter of the microlens is from 1:7 and 1:5.

4. The CMOS image sensor according to claim 3, wherein the ratio of the thickness of the microlens to the bottom diameter of the microlens is between 0.16:1 and 0.17:1.

5. The CMOS image sensor according to claim 1, wherein the thickness of the microlens is about 0.41 μm and the bottom diameter of the microlens is about 2.5 μm; the thickness of the microlens is about 0.45 μm and the bottom diameter of the microlens is about 2.7 μm; or the thickness of the microlens is about 0.49 μm and the bottom diameter of the microlens is about 3.0 μm.

6. The CMOS image sensor according to claim 1, wherein the microlens has a focus of about 5 μm.

7. The CMOS image sensor according to claim 1, wherein the passivation layer comprises silicon nitride.

8. The CMOS image sensor according to claim 1, wherein a spot size is about 0.06 μm when the thickness of the microlens is 0.45 μm ±15% and the bottom diameter of the microlens is about 2.7 μm.

9. The CMOS image sensor according to claim 1, wherein the insulation layer has a refractive index of about 1.5, and the passivation layer has a refractive index of about 2.02.

10. The CMOS image sensor according to claim 1, wherein the planarization layer has a refractive index of about 1.57, and the microlens has a refractive index of about 1.59.

11. A method for fabricating a CMOS image sensor, the method comprising:
    forming a plurality of photodiodes a predetermined distance apart from each other on a semiconductor substrate;
    forming an insulation layer on an entire surface of the semiconductor substrate;
    forming a passivation layer on the insulation layer;
    forming a plurality of color filters on the passivation layer corresponding to the photodiodes, respectively;
    forming a planarization layer on an entire surface of the semiconductor substrate including the color filters; and
    forming a microlens having a bottom diameter of from 2.5 to 3.0 μm and a thickness of from 0.41 to 0.49 μm with respect to a center of the bottom diameter on the planarization layer corresponding to each of the color filters.

12. The method according to claim 11, wherein a focal length through the image sensor is 4.9 to 5.4 μm.

13. The method according to claim 11, wherein a ratio of the thickness of the microlens to the bottom diameter of the microlens is from 1:7 and 1:5.

14. The method according to claim 13, wherein the ratio of the thickness of the microlens to the bottom diameter of the microlens is between 0.16:1 and 0.17:1.

15. The method according to claim 11, wherein the thickness of the microlens is about 0.41 μm and the bottom diameter of the microlens is about 2.5 μm; the thickness of the microlens is about 0.45 μm and the bottom diameter of the microlens is about 2.7 μm; or the thickness of the microlens is about 0.49 μm and the bottom diameter of the microlens is about 3.0 μm.

16. The method according to claim 11, wherein the microlens has a focus of about 5.

17. The method according to claim 11, wherein the passivation layer comprises silicon nitride.

18. The method according to claim 11, wherein a spot size is about 0.06 μm when the thickness of the microlens is 0.45 μm ±15% and the bottom diameter of the microlens is about 2.7 μm.

19. The method, according to claim 11, wherein a refractive index of the interlay insulation layer is about 1.5, and a refractive index of the passivation layer is about 2.02.

20. The method according to claim 11, wherein a refractive index of the planarization layer is about 1.57, and a refractive index of the microlens is about 1.59.

* * * * *